(12) United States Patent
Tang et al.

(10) Patent No.: US 12,506,007 B2
(45) Date of Patent: Dec. 23, 2025

(54) METHOD OF MANUFACTURING SEMICONDUCTOR DEVICES AND SEMICONDUCTOR DEVICES

(71) Applicant: TAIWAN SEMICONDUCTOR MANUFACTURING COMPANY, LTD., Hsinchu (TW)

(72) Inventors: Hao-Ming Tang, Taipei (TW); Shu-Han Chen, Hsinchu (TW); Yun-San Chien, Hsinchu (TW); Da-Yuan Lee, Jhubei (TW); Chi On Chui, Hsinchu (TW); Tsung-Ju Chen, Hsinchu (TW); Yi-Hsin Ting, Pingtung County (TW); Han-Shen Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 606 days.

(21) Appl. No.: 17/837,848

(22) Filed: Jun. 10, 2022

(65) Prior Publication Data

US 2023/0274938 A1    Aug. 31, 2023

Related U.S. Application Data

(60) Provisional application No. 63/314,045, filed on Feb. 25, 2022.

(51) Int. Cl.
*H01L 21/28* (2025.01)
*H10D 30/01* (2025.01)
(Continued)

(52) U.S. Cl.
CPC ..... *H01L 21/28202* (2013.01); *H10D 30/024* (2025.01); *H10D 30/6211* (2025.01);
(Continued)

(58) Field of Classification Search
CPC ............. H10D 30/6211; H10D 64/693; H10D 84/0188; H10D 84/0167; H10D 30/62
See application file for complete search history.

(56) References Cited

U.S. PATENT DOCUMENTS

2005/0233525 A1    10/2005    Yeo et al.
2006/0148179 A1    7/2006    Wang et al.
(Continued)

FOREIGN PATENT DOCUMENTS

KR    10-2013-0051861 A    5/2013
TW    201917883 A    5/2019
TW    202044331 A    12/2020

*Primary Examiner* — Fernando L Toledo
*Assistant Examiner* — Adam S Bowen
(74) *Attorney, Agent, or Firm* — STUDEBAKER BRACKETT PLLC

(57) ABSTRACT

In a method of manufacturing a semiconductor device, a fin structure is formed by patterning a semiconductor layer, an isolation insulating layer is formed such that an upper portion of the fin structure protrudes from the isolation insulating layer, a gate dielectric layer is formed by a deposition process, a nitridation operation is performed on the gate dielectric layer, and a gate electrode layer is formed over the gate dielectric layer. The gate dielectric layer as formed includes silicon oxide, and the nitridation operation comprises a plasma nitridation operation using a $N_2$ gas and a $NH_3$ gas.

20 Claims, 16 Drawing Sheets

(51) Int. Cl.
*H10D 30/62* (2025.01)
*H10D 64/68* (2025.01)
*H10D 84/01* (2025.01)
*H10D 84/03* (2025.01)
*H10D 84/85* (2025.01)

(52) U.S. Cl.
CPC ....... *H10D 64/693* (2025.01); *H10D 84/0181* (2025.01); *H10D 84/0188* (2025.01); *H10D 84/0193* (2025.01); *H10D 84/038* (2025.01); *H10D 84/853* (2025.01)

(56) References Cited

U.S. PATENT DOCUMENTS

| | | |
|---|---|---|
| 2008/0254588 A1 | 10/2008 | Chuang et al. |
| 2013/0001707 A1 | 1/2013 | Lin et al. |
| 2013/0119482 A1 | 5/2013 | Wann et al. |
| 2015/0255277 A1 | 9/2015 | Tong et al. |
| 2019/0131382 A1 | 5/2019 | Lu et al. |
| 2019/0378913 A1* | 12/2019 | Li .................. H10D 84/0144 |
| 2020/0035808 A1 | 1/2020 | Bao et al. |
| 2020/0176247 A1 | 6/2020 | Li et al. |

* cited by examiner

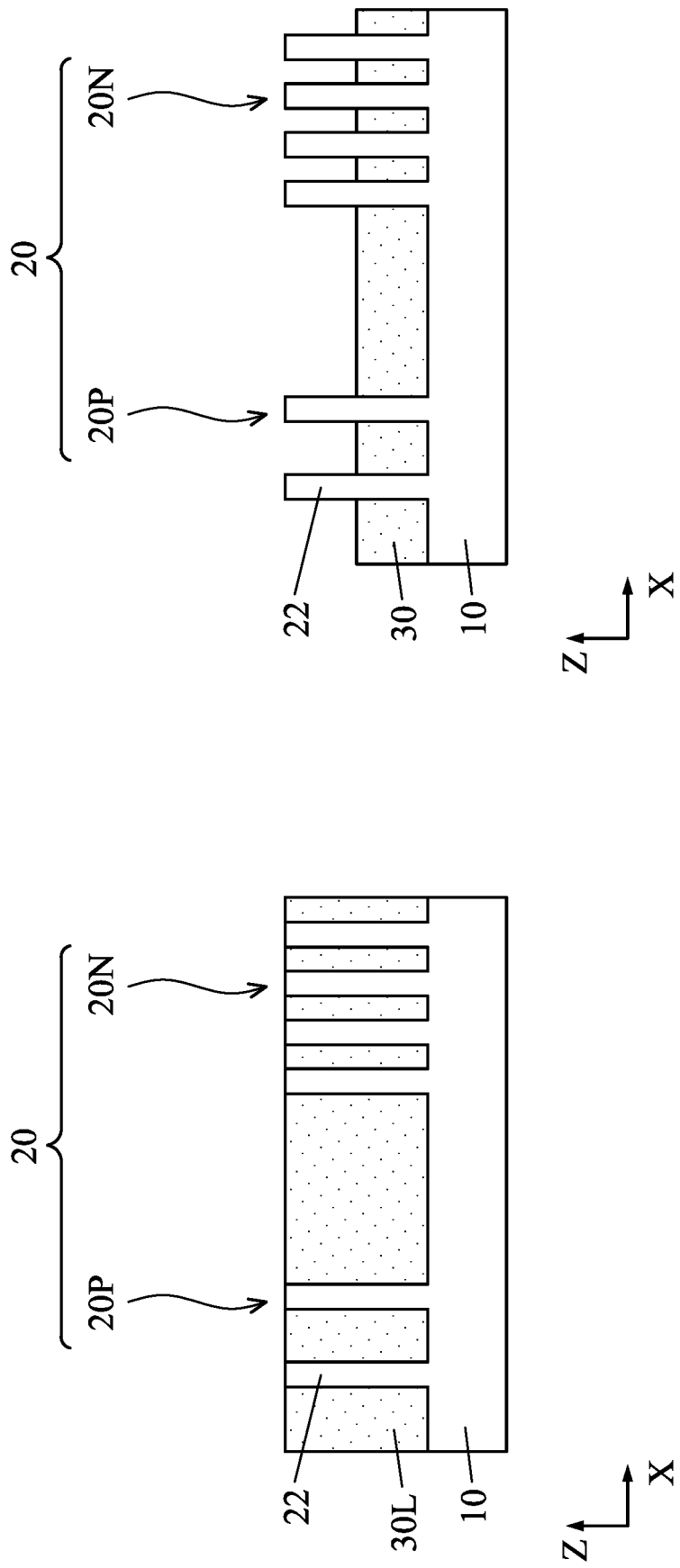

METHOD OF MANUFACTURING SEMICONDUCTOR DEVICES AND SEMICONDUCTOR DEVICES

RELATED APPLICATIONS

This application claims priority to U.S. Provisional Patent Application No. 63/314,045 filed Feb. 25, 2022, the entire contents of which are incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (FinFET) and a gate-all-around (GAA) FET. As transistor dimensions are continually scaled down to sub 10-15 nm technology nodes, further improvements of the FinFET, for example, a precise critical dimension (CD) control and defect or damage free fin formation processes, are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 3B, 3C and 3D show cross sectional views of various stages of a sequential process for manufacturing a FinFET device according to an embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described. In the entire disclosure, a source and a drain are interchangeably used, and a source/drain refers to one of or both of the source and the drain. In the following embodiments, materials, configurations, dimensions, processes and/or operations as described with respect to one embodiment (e.g., one or more figures) may be employed in the other embodiments, and detailed description thereof may be omitted.

In a manufacturing operation of a semiconductor device including FinFETs, a quality of a gate dielectric layer is one of the key issues. In particular, when silicon oxide is used as the gate dielectric layer, it is required that the gate dielectric layer show a high reliability in electrical property (e.g., a high time dependent dielectric breakdown (TDDB) property) and a high physical property (e.g., a high etching durability). In the present disclosure, a novel process for improving the quality of the silicon oxide gate dielectric layer by introducing nitrogen into the silicon oxide layer is provided.

Figures 3A, 3B:
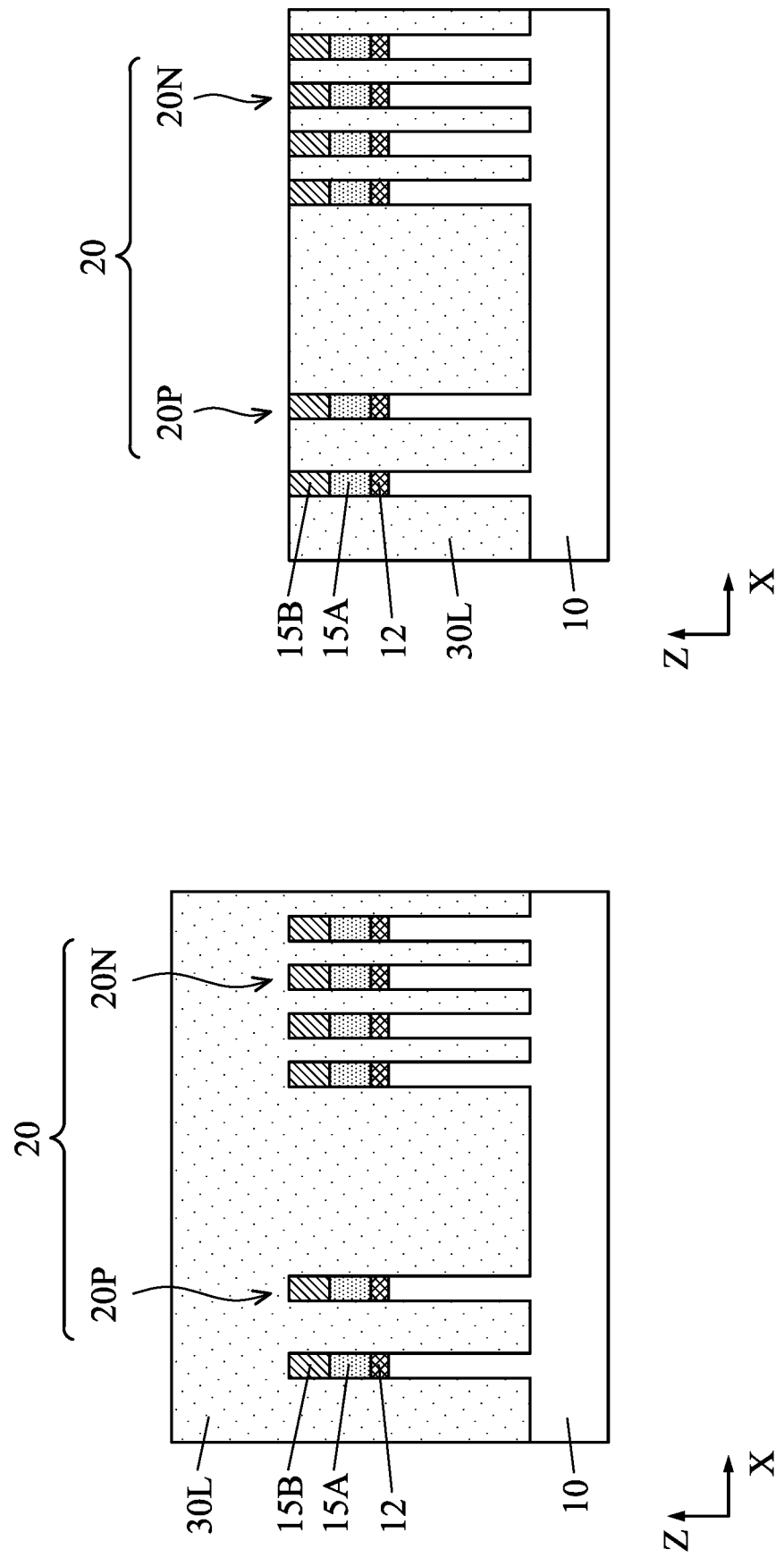
Figure 4B:
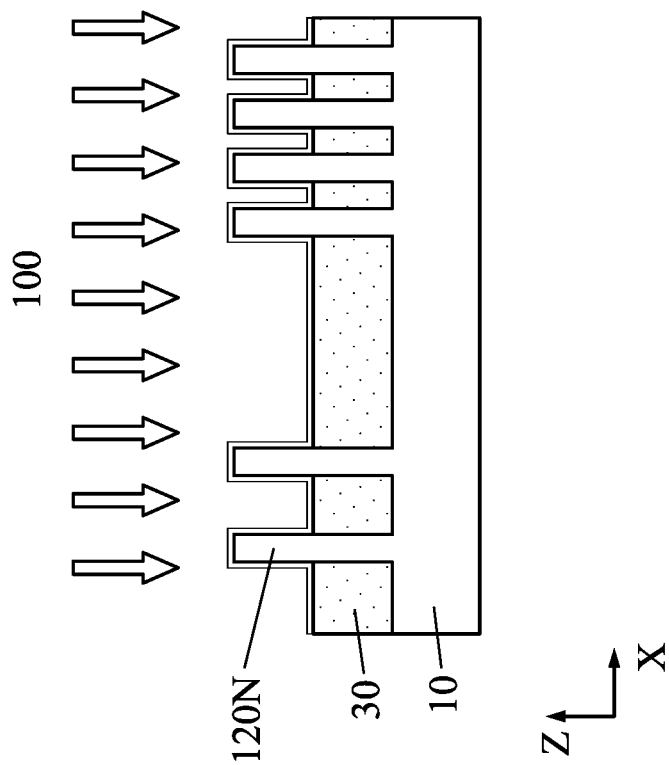
FIGS. 4A, 4B, 4C, 4D, 4E and 4F show cross sectional views of various stages of a sequential process for manufacturing a FinFET device according to an embodiment of the present disclosure.
Figure 4A:
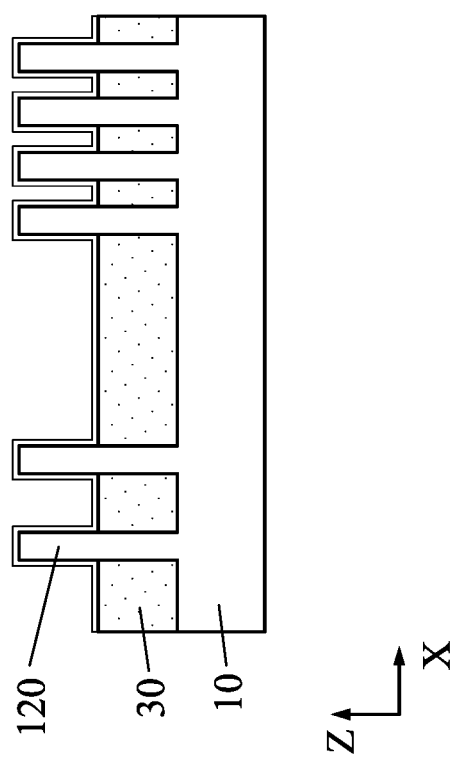
Figure 4D:
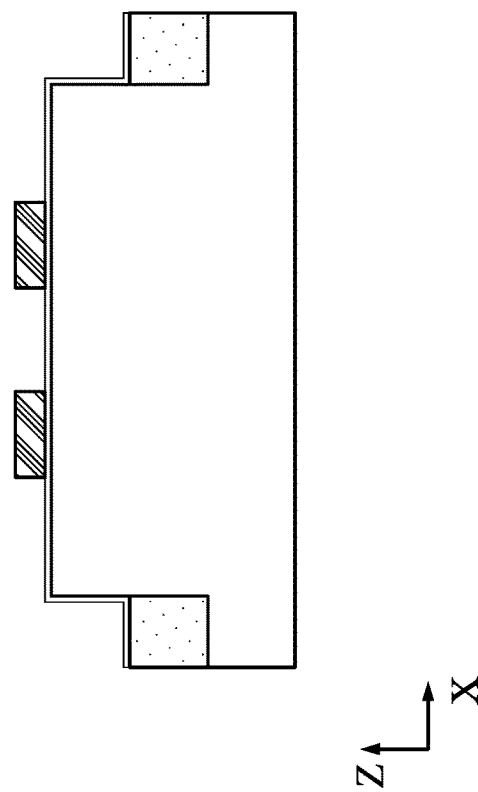
Figure 4C:
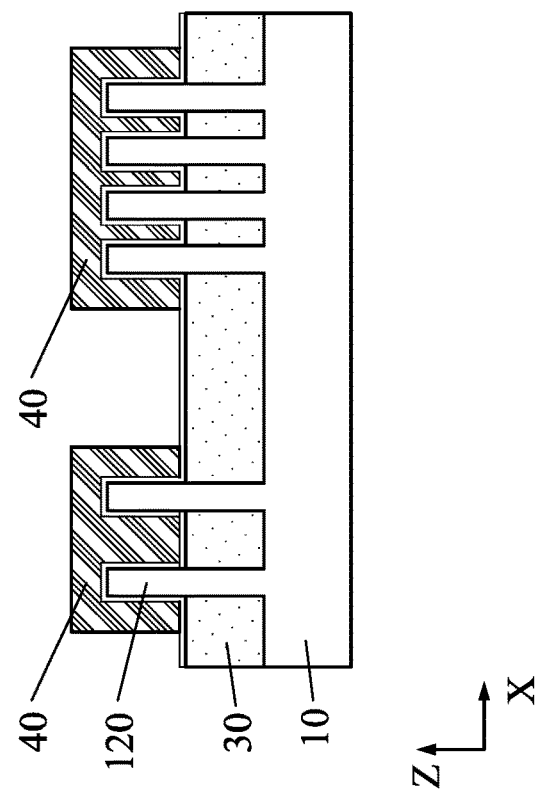
Figure 4F:
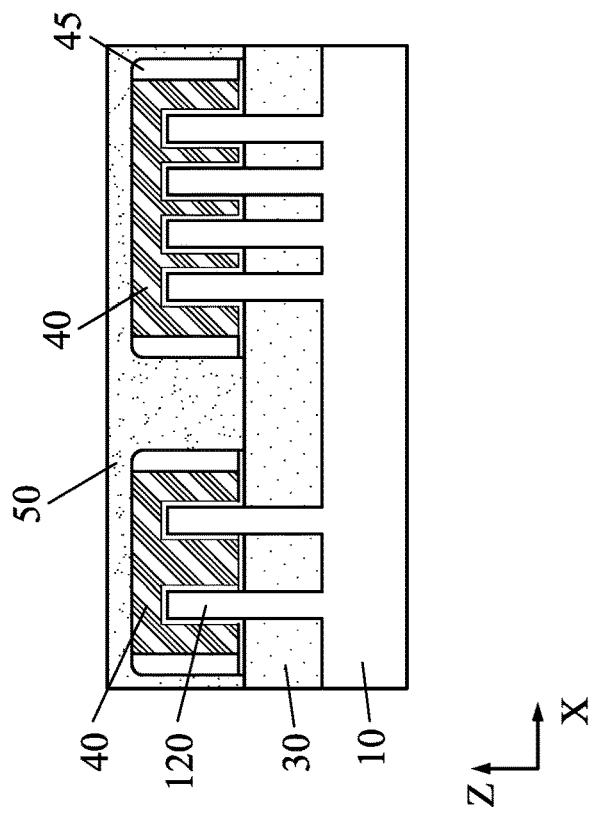
Figure 4E:
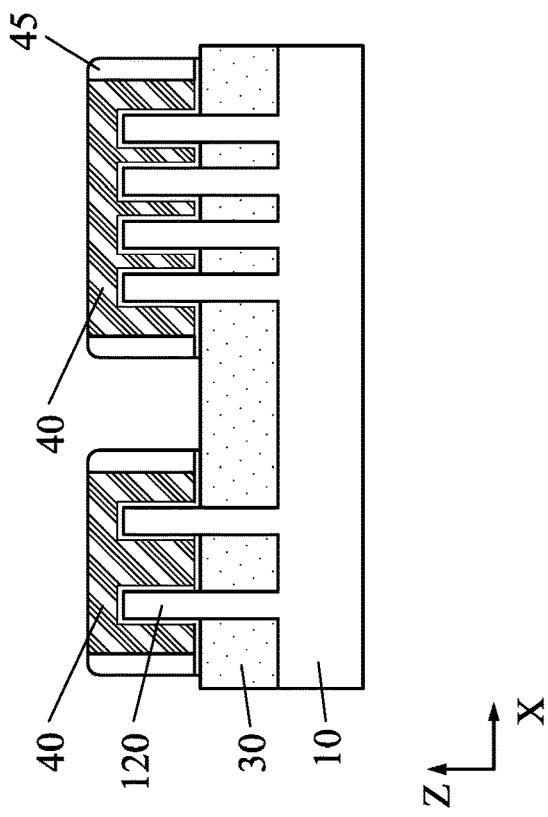
Figure 5:
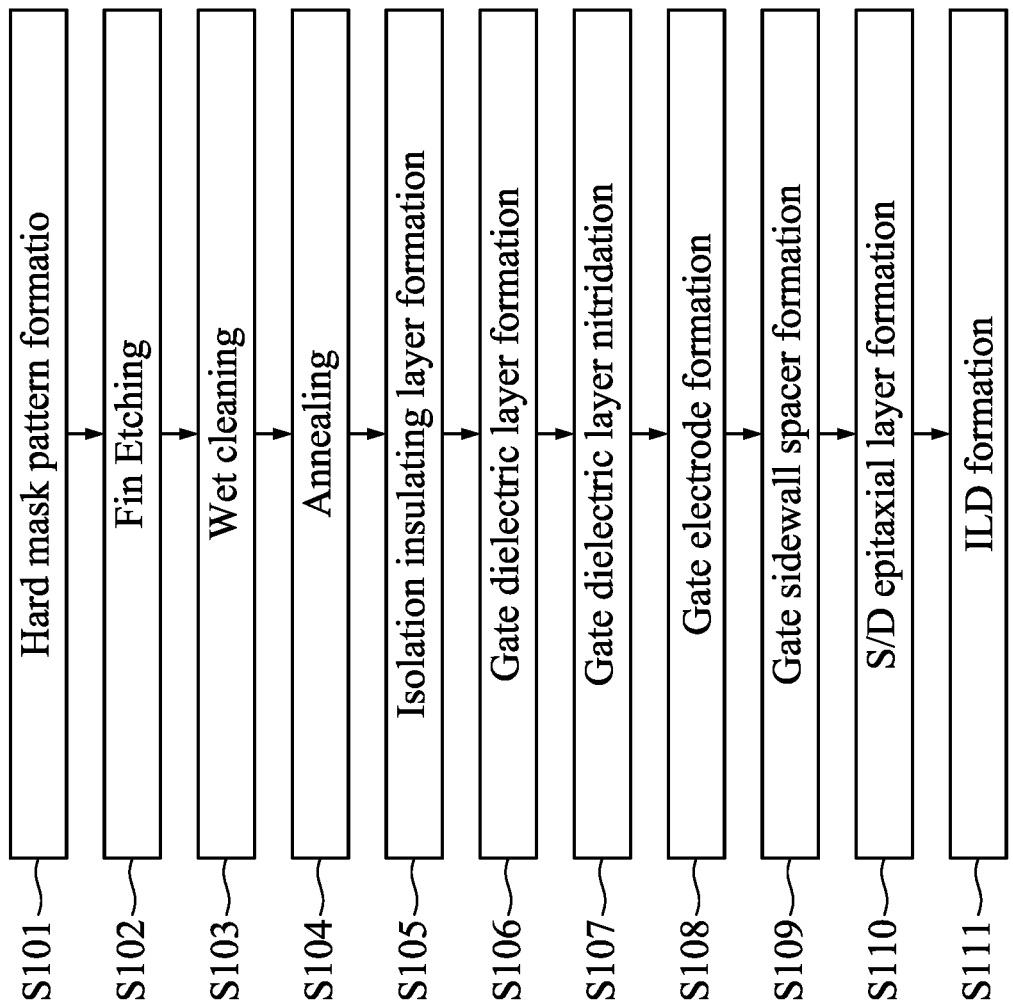
FIG. 5 shows a flow chart of a sequential manufacturing operation of a FinFET device according to an embodiment of the present disclosure.

FIGS. 1A-4F show views of various stages of, and FIG. 5 shows a flow chart of a sequential manufacturing operation of a FinFET device according to an embodiment of the present disclosure. It is understood that additional operations can be provided before, during, and after processes shown by FIGS. 1A-4F and FIG. 5, and some of the operations described below can be replaced or eliminated, for additional embodiments of the method. The order of the operations/processes may be interchangeable.

Figure 1A:
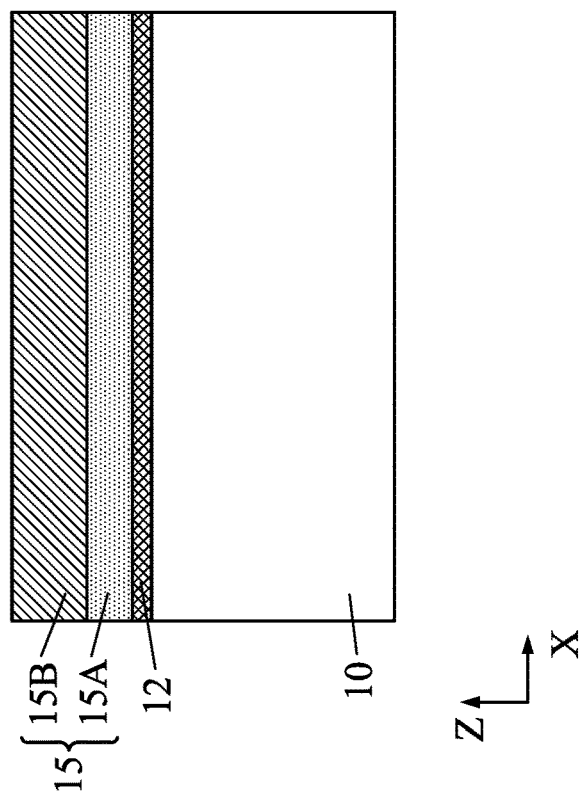
FIGS. 1A, 1B, 1C and 1D show cross sectional views of various stages of a sequential process for manufacturing a FinFET device according to an embodiment of the present disclosure.

At S101 of FIG. 5, a hard mask pattern for forming fin structures is formed. In some embodiments, as shown in FIG. 1A, a hard mask layer 15 is formed over a substrate 10. In one embodiment, substrate 10 includes a single crystalline semiconductor layer on at least its surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In one embodiment, the substrate 10 is made of Si. The substrate 10 may include various regions that have been suitably doped with impurities (e.g., p-type or n-type conductivity). The dopants are, for example boron ($BF_2$) for an n-type FinFET and phosphorus, arsenic for a p-type FinFET.

In some embodiments, the mask layer 15 includes a first mask layer 15A and a second mask layer 15B. In some embodiments, the first mask layer 15A includes a silicon nitride layer, and the second mask layer 15B includes a silicon oxide layer. The first and second mask layers 15A and 15B are formed by chemical vapor deposition (CVD), physical vapor deposition (PVD) including sputtering, atomic layer deposition (ALD), or other suitable film formation process. In some embodiments, a pad oxide layer 12 made of a silicon oxide, which can be formed by a thermal oxidation, is formed before the first mask layer 15A is formed.

Figure 1B:
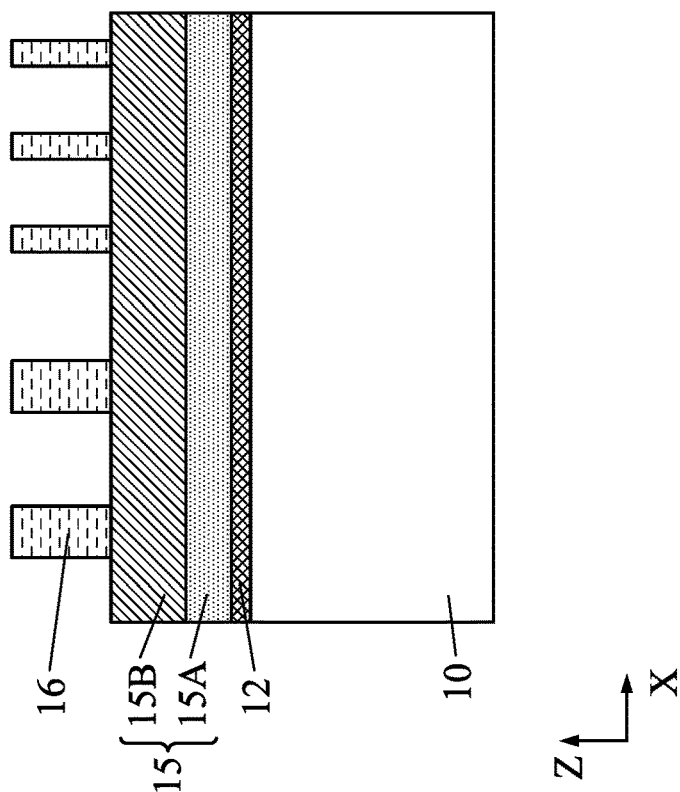
Figure 1D:
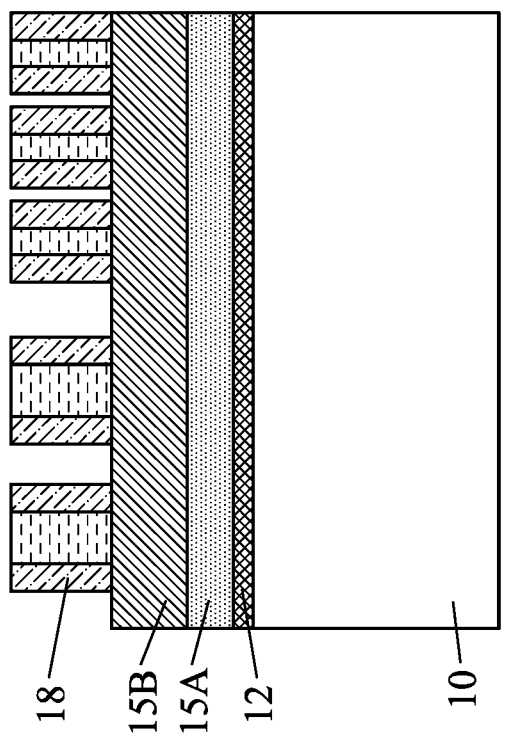
Figure 1C:
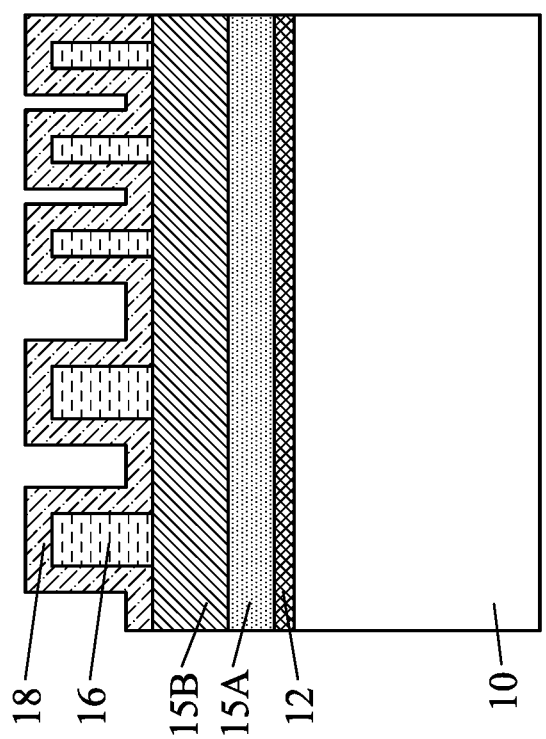
Figure 2A:
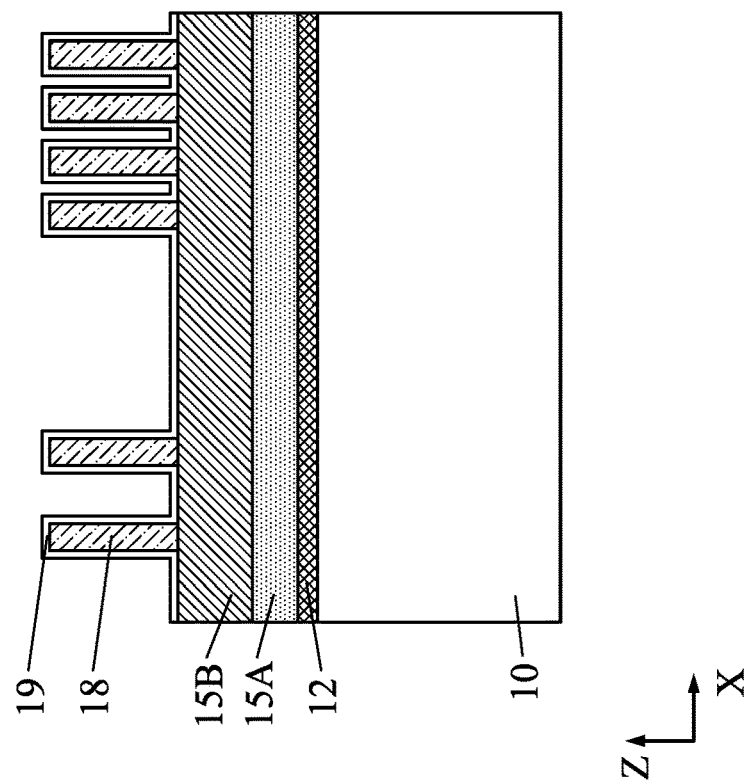
FIGS. 2A, 2B, 2C and 2D show cross sectional views of various stages of a sequential process for manufacturing a FinFET device according to an embodiment of the present disclosure.

In some embodiments, fin structures are formed by using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, as shown in FIG. 1B, a sacrificial layer is formed over a substrate and patterned using one or more photolithography and etching processes, to form mandrel patterns (sacrificial patterns) 16. Then, a blanket layer 18 is formed as shown in FIG. 1C, and anisotropic etching is performed to form sidewall spacers 18 alongside the mandrel patterns using a self-aligned process, as shown in FIG. 1D. Then, the mandrel patterns 16 are removed, and the remaining spacers 18 are used as a mask pattern 18 as shown in FIG. 2A. In some embodiments, one or more additional sidewall formation processes are performed to form mask patterns having further reduced pitches.

As shown in FIG. 2A, the mask pattern 18 includes a plurality of line patterns corresponding to one or more fin structures in a p-type region and one or more fin structures in an n-type region. In some embodiments, a pitch of the mask pattern 18 in the p-type region is greater than a pitch of the mask pattern 18 in the n-type region.

Figure 2B:
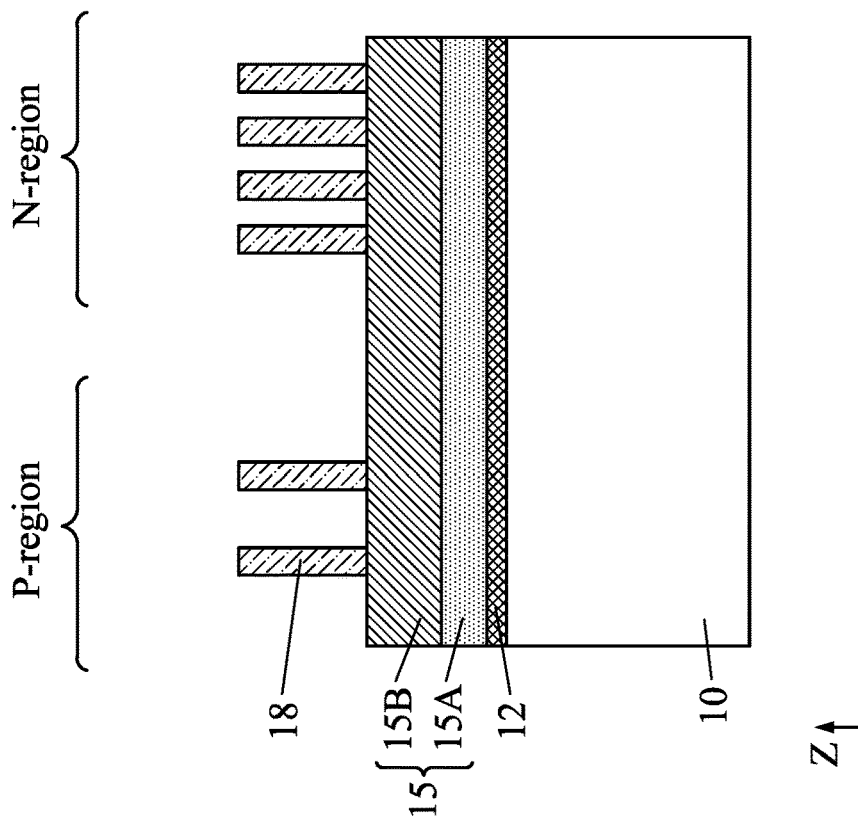

Further, as shown in FIG. 2B, a cap layer 19 is further formed over the mask pattern 18 in some embodiments. In some embodiments, the cap layer 19 is made of one or more of silicon oxide, silicon nitride, silicon oxynitride (SiON), SiOCN, SiCN, fluorine-doped silicate glass (FSG), or a low-k dielectric material. In some embodiments, the cap layer 19 is formed by ALD. In some embodiments, a thickness of the cap layer 19 is in a range from about 0.5 nm to about 5 nm.

Figure 2D:
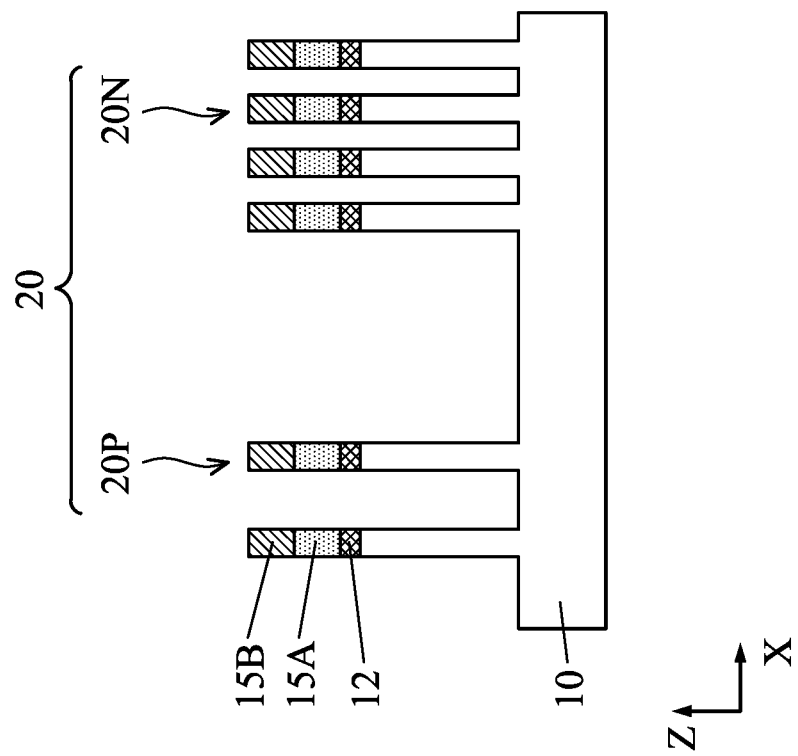
Figure 2C:
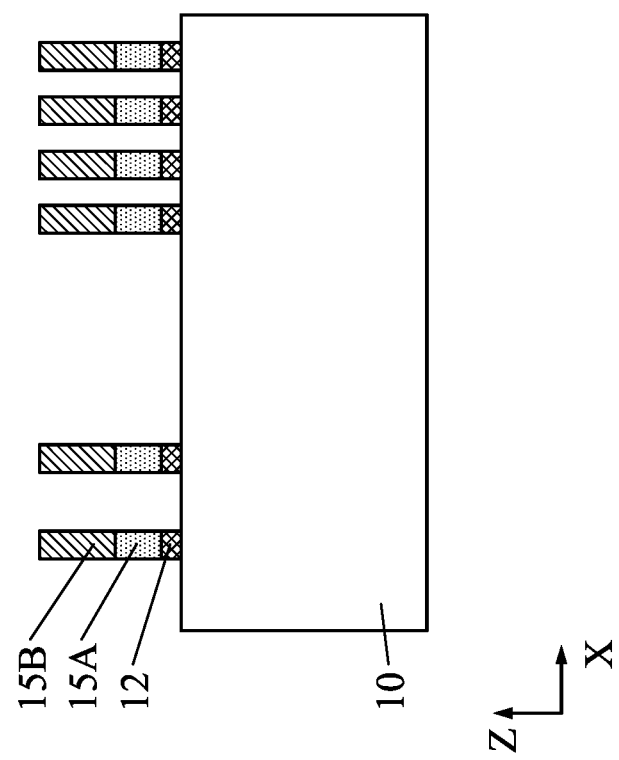

Then, the mask layer 15 and the pad oxide layer 12 are patterned by using one or more etching operations, as shown in FIG. 2C. In some embodiments, before the mask layer 15 and the pad oxide layer 12 are patterned, the mask patterns 18 are cut into short pieces to form patterns corresponding to individual fin structures by using one or more lithography and etching operations. In some embodiments, one or more unnecessary patterns (e.g., dummy structures) are also removed by the etching.

Further, at S102 of FIG. 5, the substrate 10 is patterned by using the patterned mask layer as an etching mask, thereby forming fin structures 20N and 20P (collectively fin structures 20) extending in the Y direction. In some embodiments, the fin structures 20N are for an n-type FET, and the fin structures 20P are for a p-type FET. In FIG. 2D, two fin structures 20P are arranged in the X direction in the p-type region and four fin structures 20N are arranged in the X direction in the n-type region. However, the number of the fin structures is not limited to two or four, and may be as small as one and three or more. In some embodiments, one or more dummy fin structures are formed on both sides of the fin structures 20 to improve pattern fidelity in the patterning operations.

After the fin structures 20 are formed, at S103 of FIG. 5, one or more cleaning operations are performed. In some embodiments, a meniscus re-configuration cleaning using heated isopropyl alcohol is used as the cleaning operation.

In some embodiments, after the wet cleaning operation, at S104 of FIG. 5, a first annealing operation is performed to remove damage caused to the sidewalls of the fin structures. In some embodiments, the annealing operation includes rapid thermal annealing at a temperature in a range from about 900° C. to about 1100° C. for about 1 sec to 20 sec. In other embodiments, the temperature is in a range from about 950° C. to 1050° C. In other embodiments, the time duration is in a range from about 5 sec to 15 sec. In some embodiments, the annealing operation is performed in an inert gas (Ar, He and/or $N_2$) ambient. In other embodiments, the annealing operation is performed under a pressure in a range from $1\times10^{-7}$ Torr to $5\times10^{-6}$ Torr. The annealing operation causes hydrogen and fluorine atoms to diffuse out from the fin structures and re-crystalizes the damaged areas. When the temperature is lower than the aforementioned ranges, hydrogen and fluorine may not be effectively removed from the damaged areas of the fin structures, and when the temperature is higher than the aforementioned ranges, the fin structure may bend and be damaged. When the process time is shorter than the aforementioned ranges, hydrogen and fluorine may not be effectively removed from the damaged areas of the fin structures, and when the process time is longer than the aforementioned ranges, previously formed diffusion areas may be damaged.

Next, at S105 of FIG. 5, one or more insulating material layers 30L for an isolation insulating layer are formed over the fin structures, as shown in FIG. 3A. In some embodiments, the insulating material layer 30L is formed over the substrate so that the fin structures 20 are fully embedded in the insulating layer 30L. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-CVD or flowable CVD. An anneal operation may be performed after the formation of the insulating layer.

Then, as shown in FIG. 3B, a first planarization operation, such as a chemical mechanical polishing (CMP) method and/or an etch-back method, is performed such that the upper surfaces of the second mask layer 15B are exposed from the insulating material layer 30L. Then, a second planarization operation is further performed to remove the second mask layer 15B and the first mask layer 15A and to expose the upper surfaces of the fin structures 20, as shown in FIG. 3C. In some embodiments, the first and second planarization operations are combined.

Then, as shown in FIG. 3D, the insulating material layer 30L is recessed to form an isolation insulating layer 30 so that the upper portions (channel regions 22) of the fin structures 20 are exposed. With this operation, the fin structures 20 are electrically separated from each other by the isolation insulating layer 30, which is also called a shallow trench isolation (STI).

In some embodiments, before the isolation insulating layer 30 is formed, one or more insulating liner layer is formed over the fin structures 20. The insulating liner layer includes silicon oxide, silicon nitride, silicon oxynitride (SiON), SiOCN, SiCN, or any other suitable material. The insulating liner layer formed on the channel regions 22 of the fin structures is removed when the isolation insulating layer 30 is recessed, and the lower part of the fin structures is covered by the insulating liner layer in the isolation insulating layer 30.

In some embodiments, before the isolation insulating layer 30 is formed and before the liner layer is formed, one or more liner semiconductor layers are formed over the fin structures. In some embodiments, the liner semiconductor layers include a first liner semiconductor layer including silicon, SiGe or Ge. In certain embodiments, silicon is used. The first liner semiconductor layer is formed over the fin structures to prevent fin bending. In some embodiments, the thickness of the first liner semiconductor layer is in a range from about 0.2 nm to about 4 nm and is in a range from about 0.5 nm to about 2 nm, depending on device and/or process requirements. In some embodiments, the first liner semiconductor layer is epitaxially-grown by an LPCVD process, molecular beam epitaxy, atomic layer deposition or any other suitable method. The LPCVD process is performed at a temperature of about 400° C. to 850° C., which is lower than the annealing temperature, and under a pressure of about 1 Torr to 200 Torr, using a silicon source gas such as $SiH_4$, $Si_2H_6$, or $Si_3H_8$. If SiGe or Ge is formed, the source gas includes one or more of $GeH_4$ or $Ge_2H_6$. In some embodiments, the first liner semiconductor layer is non-doped and in other embodiments, the first liner semiconductor layer is appropriately doped for the n-type fin structures 20N and p-type fin structures 20P.

After the first liner semiconductor layer is formed, one or more wet cleaning operations are performed in some embodiments. In some embodiments, a wet cleaning solution includes aqueous solutions of ammonia ($NH_3$) and hydrogen peroxide ($H_2O_2$) and/or aqueous solutions of hydrochloric acid (HCl) and hydrogen peroxide ($H_2O_2$). During the wet cleaning operation, the first liner semiconductor layer (and the fin structures 20 in some embodiments) is slightly etched.

Then, in some embodiments, a second liner semiconductor layer is formed over the fin structures. In some embodiments, the second liner semiconductor layer includes silicon, SiGe or Ge. In certain embodiments, silicon is used. The second liner semiconductor layer is formed over the fin structures to adjust dimensions (width) of the fin structures. In some embodiments, the thickness of the second liner semiconductor layer is in a range from about 0.2 nm to about 4 nm and is in a range from about 0.5 nm to about 2 nm, depending on device and/or process requirements. In some embodiments, the second liner semiconductor layer is epitaxially-grown similar to the first liner semiconductor layer. In some embodiments, the second liner semiconductor layer is non-doped and in other embodiments, the second liner semiconductor layer is appropriately doped for the n-type fin structures 20N and p-type fin structures 20P.

Next, after the isolation insulating layer 30 is formed, at S106 of FIG. 5, as shown in FIG. 4A, a gate dielectric layer 120 is formed over the channel regions 22 of the fin structures 20 and the upper surface of the isolation insulating layer 30. In some embodiments, the gate dielectric layer 120 is silicon oxide formed by CVD including low pressure CVD and plasma enhanced CVD, ALD including plasma enhanced ALD, or other suitable film formation process. In some embodiments, a thickness of the gate dielectric layer 120 is in a range from about 0.5 nm to about 10 nm and is in a range from about 1 nm to about 6 nm in other embodiments, depending on the design and/or process requirements.

Then, at S107 of FIG. 5, as shown in FIG. 4B, a nitridation operation 100 is performed on the gate dielectric layer 120 to nitride the surface portion of the gate dielectric layer 120.

In some embodiments, the nitridation process is performed by using plasma with a source gas of $N_2$ and $NH_3$. In some embodiments, the flow ratio of $NH_3/(N_2+NH_3)$ is in a range from about 0.4 to 1.0. In some embodiments, a flow amount of $NH_3$ is greater than a flow amount of $N_2$. In some embodiments, the flow ratio is in a range from about 0.4 to 0.6. In other embodiments, the flow ratio is in a range from about 0.8 to 0.95. In certain embodiments, the flow ratio is in a range from about 0.6 to 0.8. When the amount of $NH_3$ increases, the uniformity of nitridation increases.

In some embodiments, the nitridation process is performed at a substrate temperature in a range from about 50° C. to about 450° C., and at a pressure in a range from about 10 mTorr to about 150 mTorr. In some embodiments, the input RF power of the plasma is in a range from about 300 W to about 2000 W. The RF power is applied in pulses having a duty ratio of about 5% to about 70% in some embodiments. The nitridation time period is in a range from about 20 sec to about 150 sec depending on the design and/or process requirements.

After the nitridation process, the gate dielectric layer 120N has a composition $SiO_{2-x}N_x$, where x is about 0.01 to about 0.2 in some embodiments, and x is about 0.05 to 0.1 in other embodiments. In some embodiments, the gate dielectric layer 120N has a lower nitrogen concentration region where x is about 0.01 to about 0.05 and a higher nitrogen concentration region where x is about 0.1 to about 0.2.

After the nitridation process, at S108 of FIG. 5, as shown in FIGS. 4C and 4D, a gate electrode layer 40 is formed over the channel regions 22 of the fin structures. In some embodiments, the gate electrode layer 40 includes silicon such as polycrystalline silicon or amorphous silicon. The thickness of the gate electrode layer 40 is in a range from about 100 nm to about 200 nm in some embodiments. The gate electrode layer 40 is deposited using CVD, including LPCVD and PECVD, PVD, ALD, or other suitable process and patterned by using, for example, a hard mask layer including one or more layers of silicon nitride and silicon.

In the embodiment of FIG. 4C-4D, one gate electrode layer 40 is disposed over two fin structures 20P in the p-type region, and one gate electrode layer 40 is disposed over four fin structures 20N in the n-type region. However, the number of the fin structures per gate electrode layer is not limited, and can be one, two, three or more than four. In other embodiments, one gate electrode layer 40 is formed over one or more n-type fin structures 20N and one or more p-type fin structures 20P.

After the gate electrode layer 40 is formed, at S109 of FIG. 5, a gate sidewall spacer 45 is formed as shown in FIG. 4E. A blanket layer of an insulating material for sidewall spacers is conformally formed by using CVD or other suitable methods. The blanket layer is deposited in a conformal manner so that it has substantially equal thicknesses on vertical surfaces, such as the sidewalls, horizontal surfaces, and the top of the sacrificial gate structure. In some embodiments, the blanket layer is deposited to a thickness in a range from about 2 nm to about 10 nm. In one embodiment, the insulating material of the blanket layer is a silicon nitride-based material, such as SiN, SiON, SiOCN or SiCN and combinations thereof. The sidewall spacers are formed on opposite sidewalls of the gate electrode layer 40.

Subsequently, at S110 of FIG. 5, a source/drain epitaxial layer is formed. In some embodiments, the fin structures of source/drain regions are recessed down below the upper surface of the isolation insulating layer 30 by using dry etching and/or wet etching, and then one or more semiconductor layers are epitaxially formed over the recessed fin structures. In other embodiments, one or more semiconductor layers are epitaxially formed over the source/drain region of the non-recessed fin structure. The source/drain epitaxial layer for an n-type FET includes one or more layers of SiC, SiP and SiCP, and the source/drain epitaxial layer for a p-type FET includes one or more layers of SiGe, SiGeSn, which may be doped with B. In at least one embodiment, the epitaxial layers are epitaxially-grown by an LPCVD process, molecular beam epitaxy, atomic layer deposition or any other suitable method. The LPCVD process is performed at a temperature of about 400° C. to about 850° C. and under a pressure of about 1 Torr to about 200 Torr, using a silicon source gas such as $SiH_4$, $Si_2H_6$, or $Si_3H_8$; a germanium source gas such as $GeH_4$ or $Ge_2H_6$; a carbon source gas such as $CH_4$ or $SiH_3CH_3$; a phosphorus source gas such as $PH_3$; and/or a boron source gas such as $B_2H_6$. In some embodiments, two or more layers with different compositions (e.g., different P, C, Ge and/or B concentrations) are formed as the source/drain epitaxial layers.

Subsequently, at S111 of FIG. 5, a first interlayer dielectric (ILD) layer 50 is formed over the source/drain epitaxial layers and the gate electrode layer 40, as shown in FIG. 4F. The materials for the first ILD layer 50 include compounds comprising Si, O, C and/or H, such as silicon oxide, SiCOH and SiOC. Organic materials, such as polymers, may be used for the first ILD layer 50.

Figure 6A:
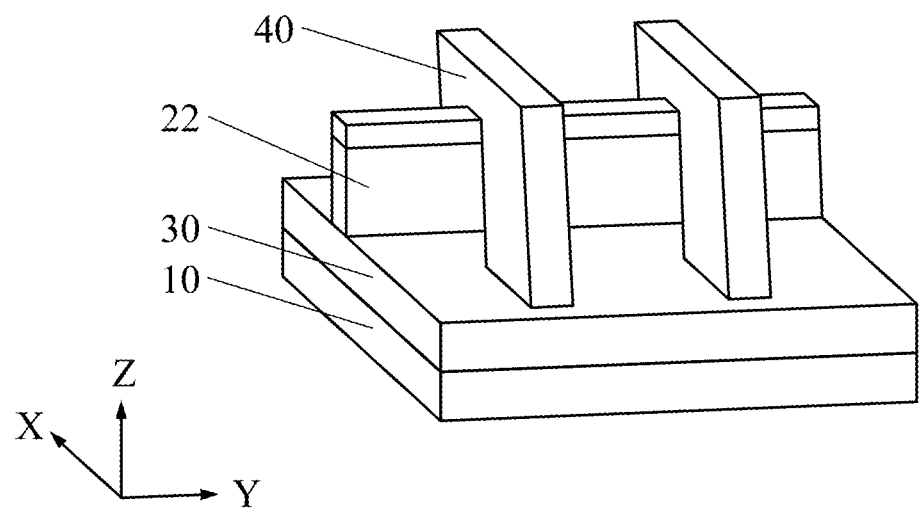
FIG. 6A is a perspective view after a gate electrode layer is formed.
Figure 6B:
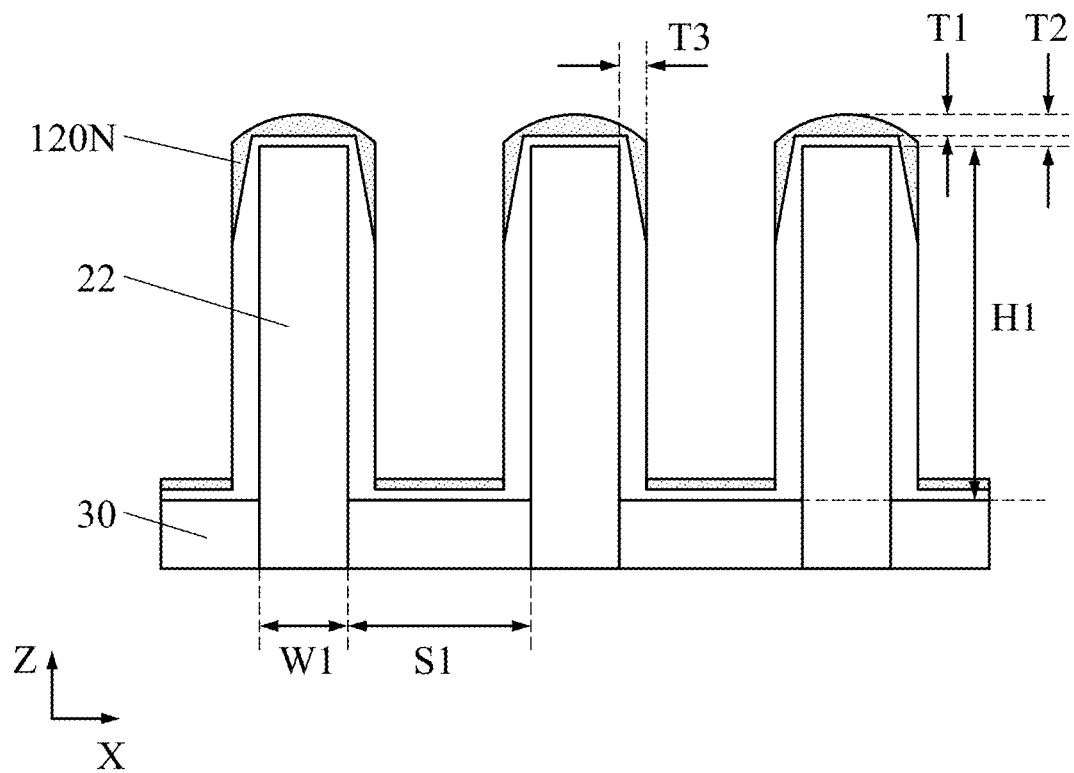
FIG. 6B shows a cross sectional view of the gate dielectric layer and the fin structures according to an embodiment of the present disclosure.

FIG. 6A is a perspective view after the gate electrode layer 40 is formed, and FIG. 6B shows a cross sectional view of the gate dielectric layer 120N and the fin structure 20 along the X direction.

In some embodiments, the height H1 of the channel region 22 of the fin structure 20 above the upper surface of the isolation insulating layer 30 is in a range from about 15 nm to about 85 nm depending on the design and/or process requirements. In some embodiments, the width W1 of the channel region 22 at the bottom thereof is in a range from about 4 nm to about 30 nm, and the space S1 between adjacent channel regions 22 is in a range from about 6 nm to about 30 nm, depending on the design and/or process requirements.

In some embodiments, the thickness T1 of the gate dielectric layer at the top of the channel region 22 is in a range from about 0.5 nm to about 6 nm depending on the design and/or process requirements. In some embodiments, the thickness T2 of the nitridated portion (SiON) is about 20% to about 80% of T1 or about 30% to 50% of T1. In some embodiments, the interface between the nitridated portion (SiON) and a non-nitridated portion (silicon oxide) is located at the place where the nitrogen concentration is 1/e (e: Euler's number) of the nitrogen concentration of the surface of the nitridated portion or at the place where the nitrogen concentration is below the detection limit of secondary ion mass spectroscopy (SIMS). In some embodiments, the thickness T3 of the gate dielectric layer on the sidewall of the channel region 22 is in a range from about 0.5 nm to about 6 nm depending on the design and/or process requirements. In some embodiments, T1>T3.

Figure 7A:
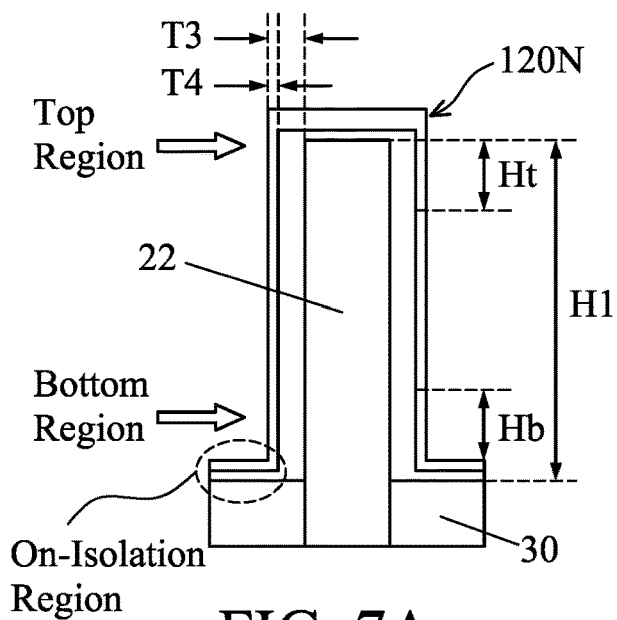
FIGS. 7A, 7B and 7C show cross sectional views of the gate dielectric layer and the fin structures according to various embodiments of the present disclosure.

In some embodiments, as shown in FIG. 7A, the nitrogen atoms are substantially uniformly introduced into the silicon oxide gate dielectric layer. In some embodiments, a uniformity of nitrogen concentration in the nitridated portion of the gate dielectric layer (e.g., at the surface of the gate dielectric layer) is in a range from about 5% to 50% with respect to an average nitrogen concentration in the nitridated portion and is in a range from about 10% to 25% in other embodiments.

In some embodiments, the nitridated gate dielectric layer 120N has a bottom region having a height Hb=5% of H1 and a top region having a height Ht=5% of H1, and the nitrogen concentration Cb of the bottom region and the nitrogen concentration Ct of the top region satisfy Cb/Ct of about 0.8 to about 1.0. In some embodiments, Cb/Ct is about 0.85 to about 0.95. In some embodiments, the bottom end of the bottom region is located at 5 nm from the upper surface of the isolation insulating layer, and the top end of the top region corresponds to the top of the channel region 22. In some embodiments, the depth T4 of the nitridated portion of the gate dielectric layer 120N formed on the sidewall of the channel region 22 is about 20% to about 80% of the total thickness T3 of the gate dielectric layer 120N formed on the sidewall of the channel region 22 or about 30% to about 50% of T3.

Further, along the depth direction of the gate dielectric layer 120N, the nitrogen concentration gradually (e.g., monotonously) decreases from the surface to the interface between the gate dielectric layer 120N and the channel region 22. In some embodiments, the nitrogen concentration at the interface between the gate dielectric layer 120N and the channel region 22 is less than about 3 atomic % and more than 0 atomic %. The nitridated gate dielectric layer 120N is a single layer of silicon oxynitride (SiON) as a whole in which the nitrogen concentration gradually changes, and thus is different from bilayers of $SiN/SiO_2$, SiN/SiON or $SiON/SiO_2$, in which the nitrogen concentration changes a stepwise manner.

Figure 7B:
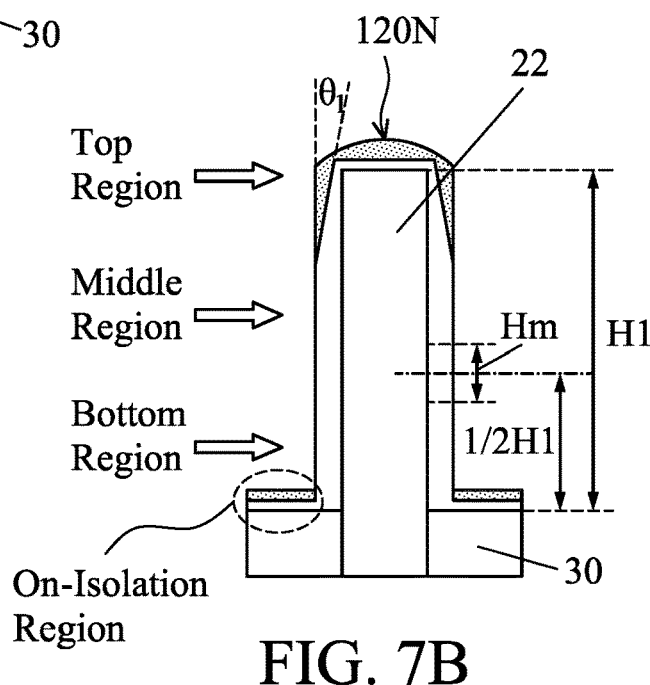

In some embodiments, as shown in FIG. 7B, the nitrogen concentration in the nitridated gate dielectric layer 120N is greater in the upper region than the bottom region. In some embodiments, the gate dielectric layer formed on the sidewall of the channel region 22 is only partially nitridated. In some embodiments, the height H2 of the nitridated portion of the gate dielectric layer formed on the sidewall of the channel region 22 from the top of the channel region 22 is about 15% to about 70% of the channel height H1 or about 20% to about 50% of the channel height H1. In some embodiments, the nitrogen concentration at the interface between the gate dielectric layer 120N and the channel region 22 is less than about 3 atomic % and more than 0 atomic %.

In some embodiments, the nitridated gate dielectric layer 120N has the bottom region having a height Hb=5% of H1, a middle region having a height Hm=5% of H1, and the top region having a height Ht=5% of H1, and the nitrogen concentration Cm of the middle region and the nitrogen concentration Ct of the top region satisfy Cm/Ct of about 0.2 to about 0.4. In some embodiments, Cb/Ct is about 0.01 to about 0.05. The middle region is ±0.05 H1 area about the height of 0.5 H1. In some embodiments, the nitrogen concentration at the middle region and/or the bottom region of the gate dielectric layer 120N is less than about 3 atomic % (and more than 0 atomic %).

In some embodiments, the angle $\theta_1$, which is formed by the sidewall plane of the gate dielectric layer formed on the sidewall of the channel region 22 and the interface plane between the nitridated portion and the remaining (non-nitridated) portion of the gate silicon oxide layer, is equal to or less than 5 degrees. In some embodiments, the angle is equal to or more than 1 degree.

When the top of the silicon oxide gate dielectric layer is nitridated more, it can reduce damage on the gate dielectric layer covering the upper portions of the fin structure (source/drain regions) which are exposed by the gate electrode etching operation.

Figure 7C:
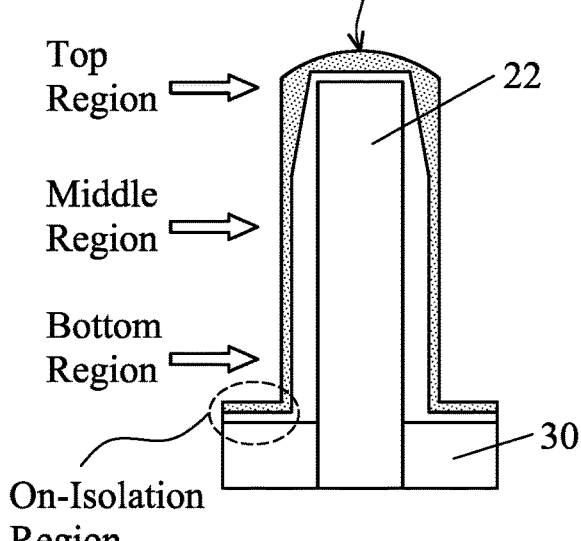

In some embodiments, as shown in FIG. 7C, the nitrogen concentration of the nitridated gate dielectric layer 120N formed on the sidewall of the channel region 22 is substantially uniform similar to FIG. 7A and the nitrogen concentration of the nitridated gate dielectric layer 120N formed on the upper region is higher than the side and bottom regions.

In some embodiments, the nitrogen concentration Cb of the bottom region and the nitrogen concentration Cm of the middle region satisfy Cb/Cm of about 0.8 to about 1.0. In some embodiments, Cb/Cm is about 0.85 to about 0.95. In some embodiments, the nitrogen concentration Cm of the middle region and the nitrogen concentration Ct of the top region satisfy Cm/Ct of about 0.4 to about 0.8. In some embodiments, Cm/Ct is about 0.5 to about 0.6.

As shown in FIGS. 7A-7C, the gate dielectric layer formed on the isolation insulating layer 30 is also nitridated. In some embodiments, the nitrogen concentration Ci of the gate dielectric layer formed on the isolation insulating layer 30 is different from the nitrogen concentration Cm, Cb of the middle and/or bottom regions. In some embodiments, the nitrogen concentration Ci is about 70% to 95% of the nitrogen concentration Cm and/or Cb, and in other embodiments, the nitrogen concentration Ci is about 105% to 130% of the nitrogen concentration Cm and/or Cb. In some embodiments, the nitrogen concentration Ci is smaller than the nitrogen concentration Ct of the top region. In some embodiments, the nitrogen concentration Ci is about 0.7 to 0.95 of the nitrogen concentration Ct. In some embodiments, the nitrogen concentration Ci of the gate dielectric layer formed on the isolation insulating layer 30 increases as a distance from the fin structure increases.

Figure 8:
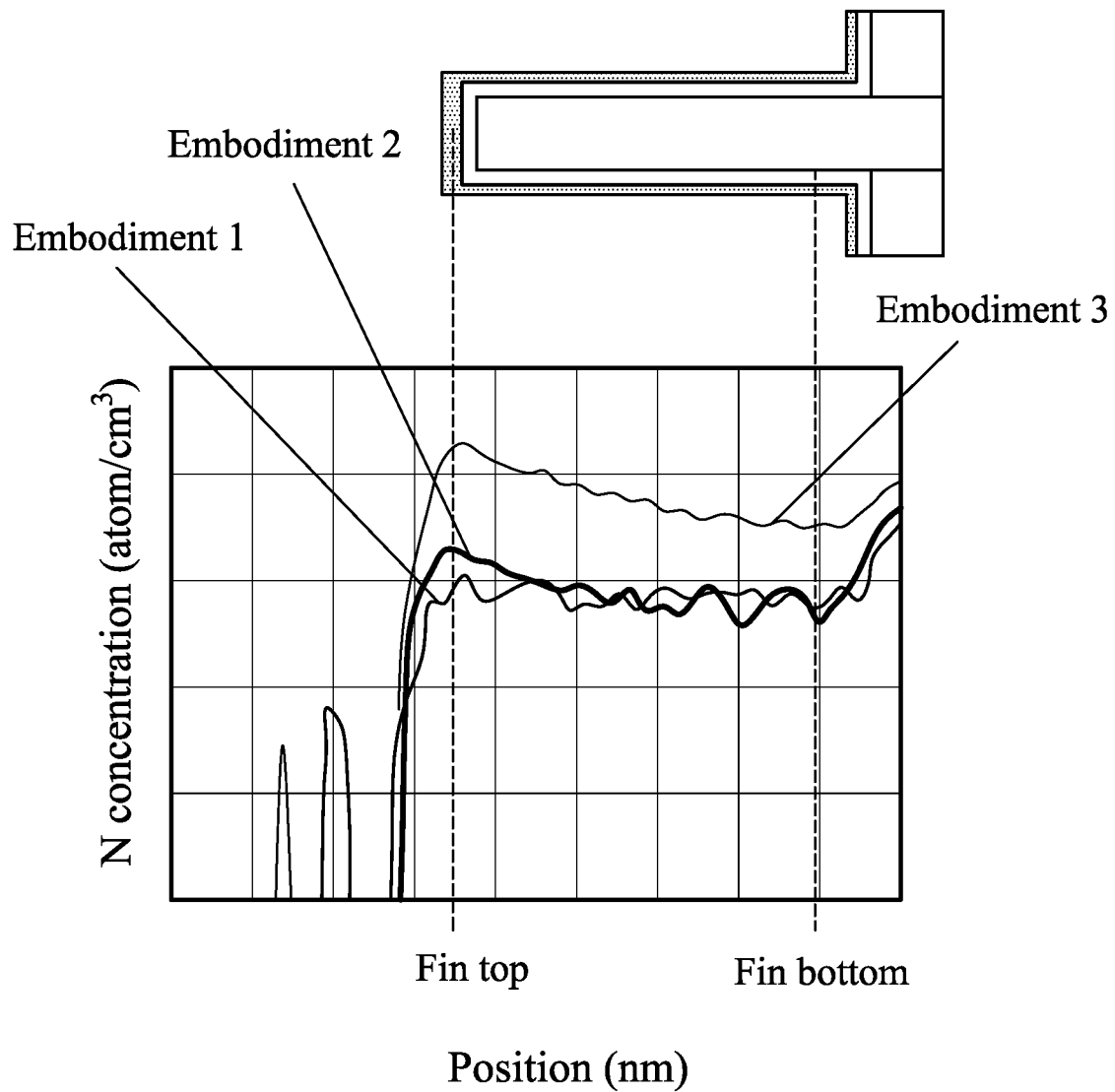
FIG. 8 shows nitrogen concentrations along the vertical direction of the nitridated gate dielectric layer according to various embodiments of the present disclosure.

As set forth above, the uniformity of the nitrogen concentration in the nitridated gate dielectric layer 120N, in particular, the side portion formed on the sidewall of the channel region 22, can be controlled by controlling at least the gas flow ratio of $N_2$ and $NH_3$. In some embodiments, the radicals caused from $NH_3$ plasma are anisotropic and the radicals caused from $N_2$ plasma are isotropic. When the flow amount of $N_2$ increases, the top region of the gate dielectric layer is nitridated more than the bottom region. FIG. 8 shows nitrogen concentrations along the vertical direction (along the sidewall of the channel region 22) of the nitridated gate dielectric layer with various flow ratio of $NH_3/(N_2+NH_3)$. In FIG. 8, Embodiment 1 corresponds to the case where the flow ratio of $NH_3/(N_2+NH_3)$ is 0.8-1.0, Embodiments 2 corresponds to the case where flow ratio of $NH_3/(N_2+NH_3)$ is 0.4-0.6 and Embodiment 3 corresponds to the case where the flow ratio of $NH_3/(N_2+NH_3)$ is about 0.3.

In some embodiments, the flow ratio of $NH_3/(N_2+NH_3)$ is changed during the nitridation operation of the gate dielectric layer. In some embodiments, a first nitridation operation is performed with a high flow ratio of $NH_3/(N_2+NH_3)$ similar to Embodiments 1 or 2, and then a second nitridation operation with a low flow ratio similar to Embodiments 2 or 3 is performed, or vice versa. In some embodiments, the flow ratio of $NH_3/(N_2+NH_3)$ is gradually changed during the nitridation operation.

Figure 9B:
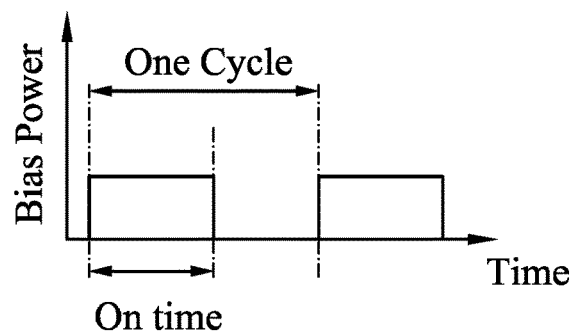
FIG. 9A shows a plasma process apparatus according to an embodiment of the present disclosure and FIG. 9B shows a pulsed-bias plasma process according to an embodiment of the present disclosure.
Figure 9A:
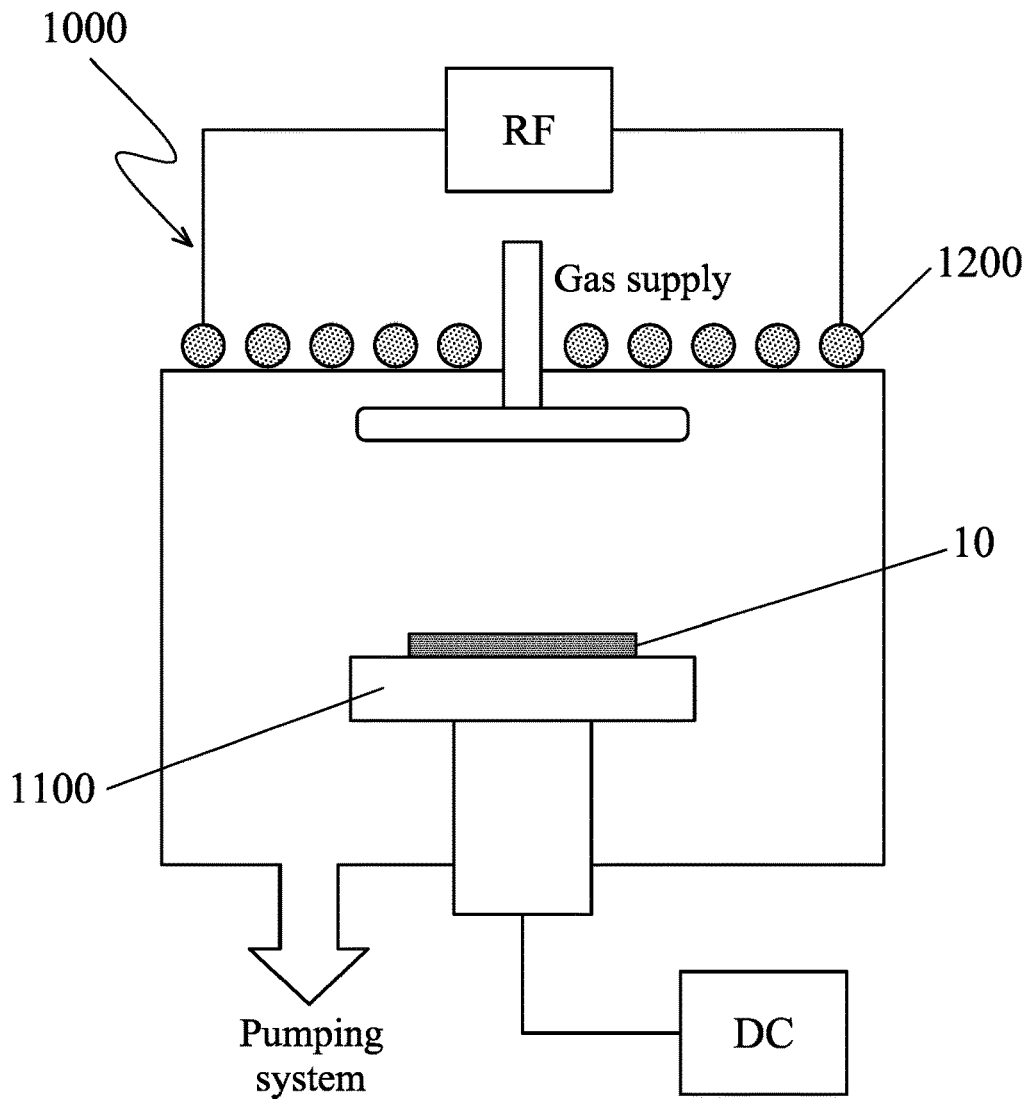

In some embodiments, the nitridation process of the gate dielectric layer includes a plasma process using a plasma process apparatus 1000 shown in FIG. 9A. FIG. 9B shows a pulsed-bias plasma operation according to embodiments of the present disclosure. In some embodiments, the substrate 10 on which the fin structures, the isolation insulating layer and the gate dielectric layers are formed is placed on a wafer stage 1100 of a vacuum chamber, and the substrate 10 and/or the wafer stage 1100 is biased with, for example, DC voltage. RF power (transformer coupled plasma (TCP) power) is applied to a counter electrode 1200 which is a coil disposed over or around the vacuum chamber in some embodiments.

During a plasma nitridation operation, a DC bias voltage is applied to a wafer stage 1100 and an RF power is applied to a TCP electrode. In a TCP plasma, a coil electrode 1200 is placed over or around a plasma nitridation chamber and an RF power is applied to the coil electrode 1200. In a pulsed bias method, the bias voltage is applied as a pulse as shown in FIG. 9B, while the power of the RF voltage is constant.

In some embodiments, a high (or on) value of the DC pulsed bias voltage (V1) is in a range from about 100 V to about 900 V, and is in a range from about 200 V to about 400 V in other embodiments. In some embodiments, the low value of the DC pulse bias is zero (off). In some embodiments, the power of RF voltage is in a range from about 400 W to about 1200 W, and is in a range from about 600 W to 1000 W in other embodiments.

In some embodiments, the frequency (1/(one cycle)) of the pulsed bias voltage is in a range from about 200 Hz to about 8000 Hz and is in a range from about 1000 Hz to about 4000 Hz in other embodiments.

A duty ratio (on-to-off cycle ratio) of the pulses is in a range from about 10% to about 80% in some embodiments, and is in a range from about 20% to 60% in other embodiments. The duty ratio can be any range of two values among 10%, 20%, 30%, 40%, 50%, 60%, 70% and 80%.

As set forth above, the process gas of $NH_3$ and/or $N_2$ is introduced from the gas supply and the nitridation process is performed accordingly.

Figure 10A:
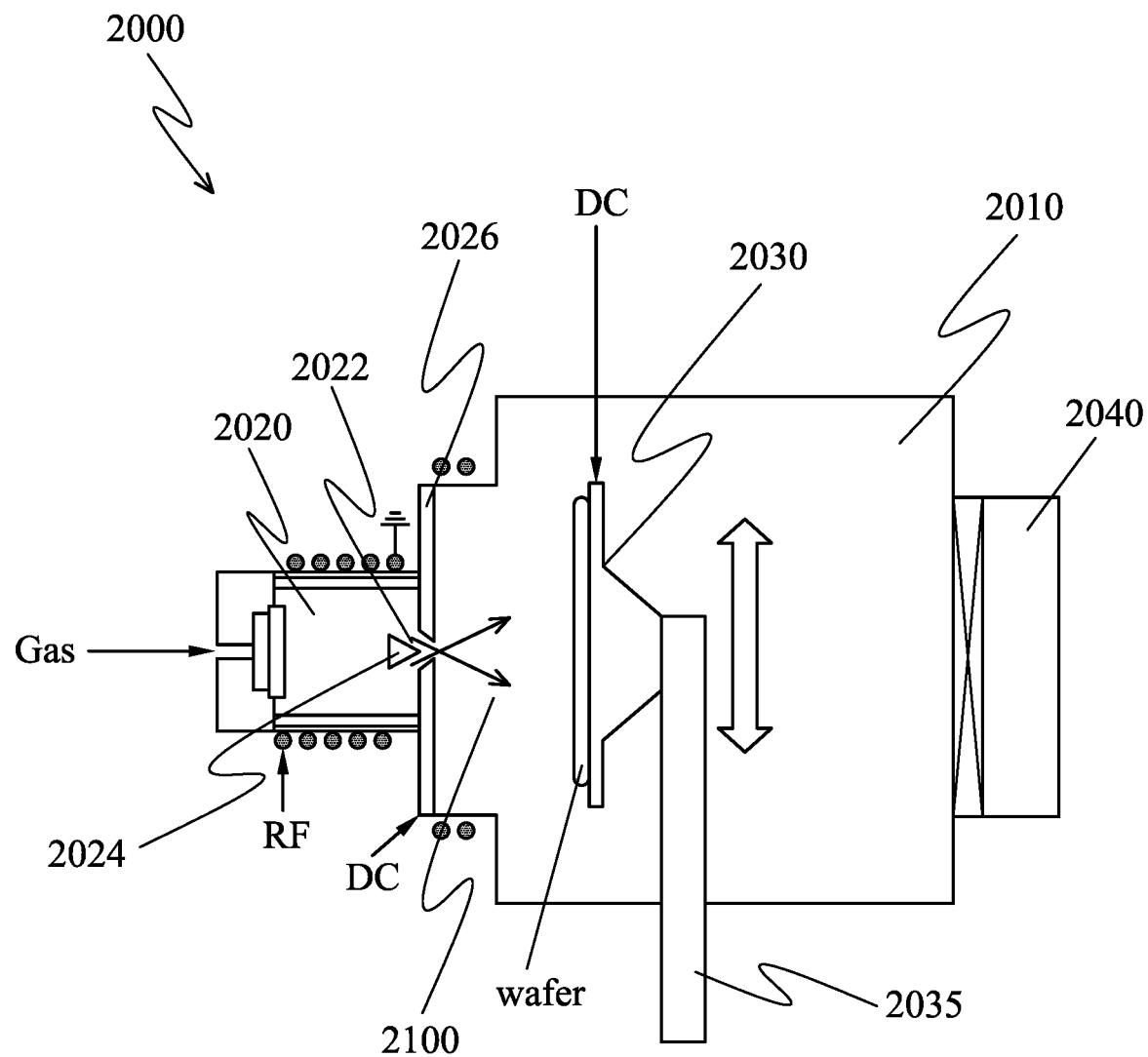
FIG. 10A shows a schematic view of a directional plasma process apparatus in accordance with an embodiment of the present disclosure.
Figure 10B:
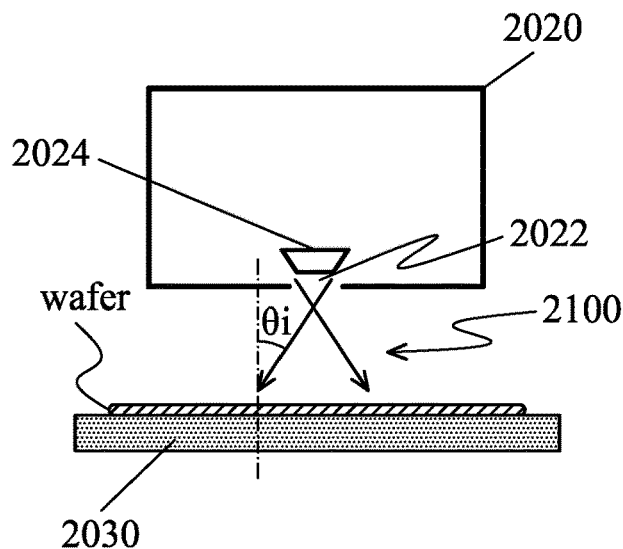
FIGS. 10B, 10C and 10D show schematic views of directional plasma process in accordance with an embodiment of the present disclosure.
Figure 10C:
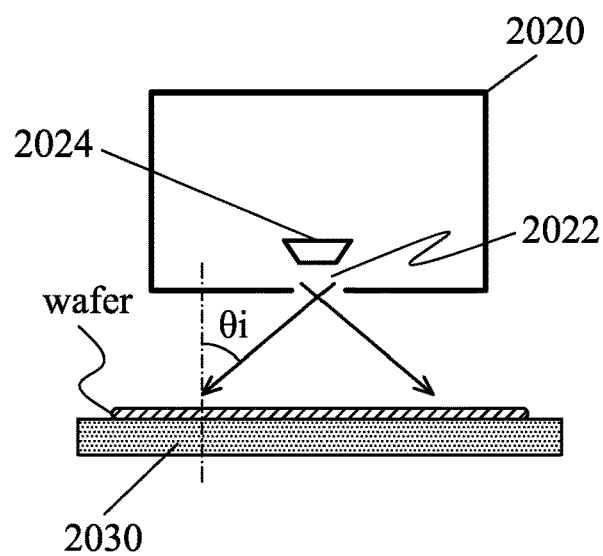
Figure 10D:
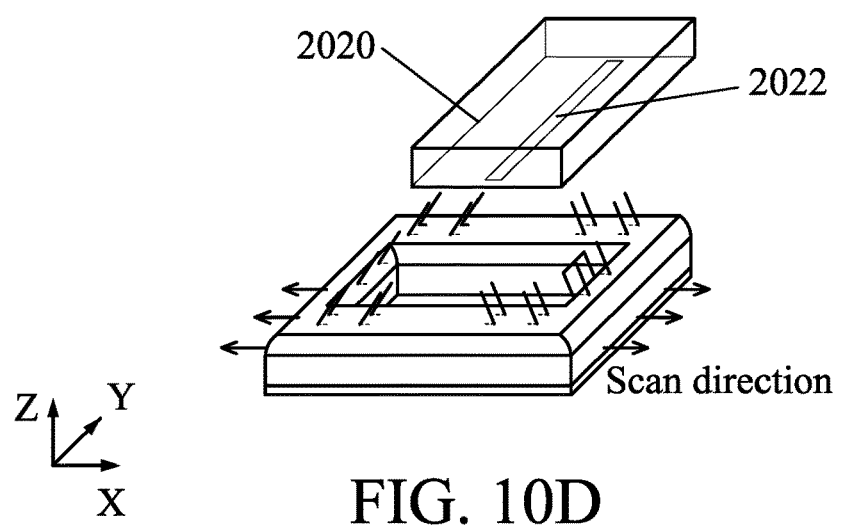

FIG. 10A shows a schematic view of a directional plasma process apparatus in accordance with an embodiment of the present disclosure. FIGS. 10B, 10C and 10D show schematic views of directional plasma processes in accordance with embodiments of the present disclosure.

As shown in FIG. 10A, the directional plasma processing apparatus, for example, a directional nitridation apparatus 2000 includes a main chamber 2010 in which a wafer stage 2030 for a wafer to be processed is disposed, and a plasma generation chamber 2020 for generating plasma. In some embodiments, the plasma is RF (radio frequency) generated plasma, using a high frequency power supply at 13.56 MHz and/or 2.45 GHz. Other frequency ranges may be used. A separation plate 2026 is disposed between the main chamber 2010 and the plasma chamber 2020. The separation plate 2026 includes a slit 2022 from which plasma beams 2100 are introduced into the main chamber. In some embodiments, an adjustable meniscus 2024 is provided over the slit 2022 in the plasma chamber side. One or more vacuum systems 2040 including, for example, a turbo molecular pump, is coupled to the main chamber and to the plasma chamber (not shown) to maintain reduced pressure states in the chambers. In some embodiments, during the nitridation process, the pressure in the main chamber is lower than the pressure in the plasma chamber.

In some embodiments, the separation plate 2026 and the wafer stage 2030 are biased by DC voltage, respectively, to extract and control the plasma beams 2100. Further, the wafer stage 2030 is movable by a moving mechanism 2035 to scan the wafer relative to the plasma beams 2100.

In some embodiments, at least one of RF and DC bias voltages is tuned to achieve an electric field that causes radicals (N radicals) to flow substantially horizontally along an in-plane direction (for example, in the X direction) relative to a surface over the substrate, or to provide a large incident angle. In some embodiments, the radicals are tuned to have a profile of momenta of the energetic species such that the momenta of the radicals or energetic species along a frontline are not the same, i.e., the momentum of radicals on the top path is different from the momentum of radicals on the bottom path. In some embodiments, the momentum of radicals on the top path is different from the momentum of radicals in the middle path above the bottom path, and the momentum of the radicals on the top path is the same as or different from the momentum of radicals on the bottom path. Any combinations can be achieved by adjustment of the electromagnetic control to tune the energies of the radicals.

In some embodiments, as shown in FIGS. 10B and 10C, a position of the meniscus 2024 is adjusted to change the incident angle θi of the plasma beams 2100. As shown in FIG. 10D, by scanning the wafer along the X direction, a groove pattern can be formed without substantially expanding the groove in the Y direction.

In some embodiments, a ratio of an amount of nitridation in the X direction to an amount of nitridation in the Y direction is about 2 or more, and is about 5 or more in other embodiments. In certain embodiments, the ratio is about 10 or more. Ideally, the ratio is as high as possible, but it can be up to about 100 in some embodiments and up to about 50 in other embodiments. Further, an amount of nitridation along the Z direction (vertical direction) is smaller than the amount of nitridation in the X direction. In some embodiments, a ratio of an amount of nitridation in the X direction to an amount of nitridation in the Z direction is about 2 or more, and is about 5 or more in other embodiments. In certain embodiments, the ratio is about 10 or more. Ideally, the ratio is as high as possible, but it can be up to about 100 in some embodiments and up to about 50 in other embodiments.

As set forth above, the process gas of $NH_3$ and/or $N_2$ is introduced from the gas supply and the nitridation process is performed accordingly. In some embodiments, the directional plasma beam 2100 is applied to the top and sidewalls of the channel region of the fin structures (e.g., applied along the X direction of FIG. 4B). By adjusting or dynamically changing the angle θi of the plasma beams 2100 during the nitridation process, various nitridation profiles as shown in FIGS. 7A-7C can be obtained. For example, a high angle θi forms the nitridation profile similar to FIG. 7B, and a low angle θi forms the nitridation profile similar to FIG. 7A.

The various embodiments or examples described herein offer several advantages over the existing art. In the embodiments of the present disclosure, it is possible to control the nitrogen profile in the nitridated silicon oxide gate dielectric layer by adjusting the gas flow ratio of $N_2$ and $NH_3$. Compared with a thermal nitridation, the plasma process of the present embodiments can create relatively shallow nitridated portions and can suppress nitrogen piling-up issues at the interface between the gate dielectric layer and the channel region, which would otherwise cause threshold voltage variations. In addition, by introducing nitrogen to the top of the gate dielectric layer, it is possible to improve etching resistance in the gate electrode etching operation, which in turn can suppress fin top damage issues.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a fin structure is formed by patterning a semiconductor layer, an isolation insulating layer is formed such that an upper portion of the fin structure protrudes from the isolation insulating layer, a gate dielectric layer is formed by a deposition process, a nitridation operation is performed on the gate dielectric layer, and a gate electrode layer is formed over the gate dielectric layer. The gate dielectric layer as formed includes silicon oxide, and the nitridation operation comprises a plasma nitridation operation using a $N_2$ gas and a $NH_3$ gas. In one or more of the foregoing and following embodiments, a flow ratio $NH_3/(N_2+NH_3)$ is in a range from 0.1 to 0.3. In one or more of the foregoing and following embodiments, a part of the gate dielectric layer formed on a sidewall of the upper portion of the fin structure includes no nitrogen or includes nitrogen in an amount of less than 3 atomic %. In one or more of the foregoing and following embodiments, a top part of the gate dielectric layer formed on a top of the upper portion of the fin structure and an upper side part of the gate dielectric layer continuous from the top part to a distance below the top of the upper portion of the fin structure include nitrogen in an amount of 20 to 40 atomic %, the distance being 15% of a height of the upper portion of the fin structure from an upper surface of the isolation insulating layer. In one or more of the foregoing and following embodiments, an angle between an interface between a nitridated portion of the gate dielectric layer and a non-nitridated portion of the gate dielectric layer and a sidewall of the gate dielectric layer is 1 degree to 5 degrees. In one or more of the foregoing and following embodiments, a nitrogen concentration at an interface between the gate dielectric layer and the upper portion of the fin structure after the nitridation operation is less than 3 atomic %. In one or more of the foregoing and following embodiments, a part of the gate dielectric layer formed on the isolation insulating layer is also nitridated. In one or more of the foregoing and following embodiments, a process temperature of the nitridation operation is in a range from 50° C. to 450° C. In one or more of the foregoing and following embodiments, a process duration of the nitridation operation is in a range from 20 sec to 150 sec.

In accordance with another aspect of the present disclosure, in a method for manufacturing a semiconductor device, a fin structure is formed by patterning a semiconductor layer, an isolation insulating layer is formed such that an upper portion of the fin structure protrudes from the isolation insulating layer, a gate dielectric layer is formed by a deposition process, a nitridation operation is performed on the gate dielectric layer, and a gate electrode layer is formed over the gate dielectric layer. The gate dielectric layer as formed includes silicon oxide, the nitridation operation comprises a plasma nitridation operation using one or more of a $N_2$ gas and a $NH_3$ gas, and a flow ratio $NH_3/(N_2+NH_3)$ is in a range from 0.4 to 1.0. In one or more of the foregoing and following embodiments, the flow ratio is in a range from 0.8 to 0.95. In one or more of the foregoing and following embodiments, an entire surface of the gate dielectric layer is nitridated. In one or more of the foregoing and following embodiments, a nitrogen concentration of the gate dielectric layer after the nitridation operation at a top region of the gate dielectric layer is greater than a nitrogen concentration at a bottom region of the gate dielectric layer. In one or more of the foregoing and following embodiments, a nitrogen concentration at an interface between the gate dielectric layer and the upper portion of the fin structure after the nitridation operation is less than 3 atomic %. In one or more of the foregoing and following embodiments, a depth of a nitridated portion of the gate dielectric layer formed on a sidewall of the upper portion of the fin structure is 20% to 80% of a thickness of the gate dielectric layer formed on the sidewall of the upper portion of the fin structure. In one or more of the foregoing and following embodiments, the gate dielectric layer after the nitridation process is a single layer in which a nitrogen concentration varies along a thickness direction.

In accordance with another aspect of the present disclosure, in a method for manufacturing a semiconductor device, a fin structure is formed by patterning a semiconductor layer, an isolation insulating layer is formed such that an upper portion of the fin structure protrudes from the isolation insulating layer, a gate dielectric layer is formed by a deposition process, a nitridation operation is performed on the gate dielectric layer, and a gate electrode layer is formed over the gate dielectric layer. The nitridation operation comprises a plasma nitridation operation using one or more of a $N_2$ gas and a $NH_3$ gas, and a flow ratio $NH_3/(N_2+NH_3)$ varies during the nitridation operation. In one or more of the foregoing and following embodiments, the flow ratio gradually varies. In one or more of the foregoing and following embodiments, the flow ratio varies in a stepwise manner twice or more. In one or more of the foregoing and following embodiments, the nitridation operation comprises a directional plasma nitridation.

In accordance with another aspect of the present disclosure, a semiconductor device includes a semiconductor fin structure disposed over a substrate and including a channel region, an isolation insulating layer from which the channel region protrudes, a gate dielectric layer disposed over the channel region, and a gate electrode disposed over the gate dielectric layer. The gate dielectric layer includes silicon oxide only partially nitridated. In one or more of the foregoing and following embodiments, a part of the gate dielectric layer formed on a sidewall of the channel region includes no nitrogen or includes nitrogen in an amount of less than 3 atomic %. In one or more of the foregoing and following embodiments, a top part of the gate dielectric layer formed on a top of the channel region and an upper side part of the gate dielectric layer continuous from the top part to a distance below the top of the channel region include nitrogen in an amount of 20 to 40 atomic %, the distance being 15% of a height of the channel region from an upper surface of the isolation insulating layer. In one or more of the foregoing and following embodiments, an angle between an interface between a nitridated portion of the gate dielectric layer and a non-nitridated portion of the gate dielectric layer and a sidewall of the gate dielectric layer is 1 degree to 5 degrees. In one or more of the foregoing and following embodiments, a nitrogen concentration at a middle side part below the upper side part of the gate dielectric layer disposed on the sidewall of the channel region include smaller amount of nitrogen than the upper side part. In one or more of the foregoing and following embodiments, a nitrogen concentration of the middle side part is less than 3 atomic %. In one or more of the foregoing and following embodiments, a nitrogen concentration at an interface between the gate dielectric layer and the channel region is less than 3 atomic %. In one or more of the foregoing and following embodiments, a horizontal part of the gate dielectric layer formed on the isolation insulating layer includes nitrogen. In one or more of the foregoing and following embodiments, an amount of nitrogen in the horizontal part is smaller than an amount of nitrogen in a top part of the gate dielectric layer formed on a top of the channel region.

In accordance with another aspect of the present disclosure, a semiconductor device includes a semiconductor fin structure disposed over a substrate and including a channel region, an isolation insulating layer from which the channel region protrudes, a gate dielectric layer disposed over the channel region, and a gate electrode disposed over the gate dielectric layer. The gate dielectric layer includes a nitridated silicon oxide portion and a silicon oxide portion disposed between the nitridated silicon oxide portion and the channel region, and a uniformity of nitrogen concentration in the nitridated silicon oxide portion is 10% to 25% with respect to an average nitrogen concentration in the nitridated silicon oxide portion. In one or more of the foregoing and following embodiments, a nitrogen concentration of the gate dielectric layer at a top region of the gate dielectric layer is greater than a nitrogen concentration at a bottom region of the gate dielectric layer. In one or more of the foregoing and following embodiments, a depth of a nitridated silicon oxide portion disposed on a sidewall of the channel region is 20% to 80% of a thickness of the gate dielectric layer formed on the sidewall of the channel region. In one or more of the foregoing and following embodiments, a nitrogen concentration in the nitridated silicon oxide portion gradually decreases from a surface to the silicon oxide portion. In one or more of the foregoing and following embodiments, a nitrogen concentration in the nitridated silicon oxide portion of the gate dielectric layer disposed on a sidewall of the channel region gradually decreases from a top of the gate dielectric layer to a bottom of the gate dielectric layer.

In accordance with another aspect of the present disclosure, a semiconductor device includes a semiconductor fin structure disposed over a substrate and including a channel region, an isolation insulating layer from which the channel region protrudes, a gate dielectric layer disposed over the channel region, a gate electrode disposed over the gate dielectric layer, and a gate sidewall spacer disposed on a sidewall of the gate electrode. The gate dielectric layer has composition $SiO_{2-x}N_x$, where x is 0.01 to 0.2. In one or more of the foregoing and following embodiments, the gate dielectric layer includes a top portion disposed on a top of the channel region and a side portion disposed on a sidewall of the channel region, and a nitrogen concentration of the top portion is different from the side portion. In one or more of the foregoing and following embodiments, the side portion includes a top side portion, a middle side portion below the top side portion and a bottom side portion below the middle side portion, and a nitrogen concentration of the top side portion is different from a nitrogen concentration of at least one of the middle side portion or the bottom side portion. In one or more of the foregoing and following embodiments, a nitrogen concentration of the middle side portion is different from a nitrogen concentration of the bottom side portion. In one or more of the foregoing and following embodiments, a nitrogen concentration of the bottom side portion is 0.85 to 0.95 times the nitrogen concentration of the top side portion. In one or more of the foregoing and following embodiments, a nitrogen concentration at an interface between the gate dielectric layer and the channel region is less than 3 atomic %.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, the method comprising:
    forming a fin structure by patterning a semiconductor layer;
    forming an isolation insulating layer such that an upper portion of the fin structure protrudes from the isolation insulating layer;
    forming a gate dielectric layer by a deposition process;
    after the gate dielectric layer is formed, introducing nitrogen into the gate dielectric layer; and
    forming a gate electrode layer over the gate dielectric layer,
    wherein the gate dielectric layer as formed is silicon oxide, and
    the introducing the nitrogen comprises a plasma nitridation operation using a $N_2$ gas and a $NH_3$ gas, and a flow ratio $NH_3/(N_2+NH_3)$ is in a range from 0.1 to 0.3.

2. The method of claim 1, wherein a part of the gate dielectric layer formed on a sidewall of the upper portion of the fin structure includes no nitrogen or includes nitrogen in an amount of less than 3 atomic %.

3. The method of claim 1, wherein a top part of the gate dielectric layer formed on a top of the upper portion of the fin structure and a side part of the gate dielectric layer continuous from the top part to a distance below the top of the upper portion of the fin structure include nitrogen in an amount of 20 to 40 atomic %, the distance being 15% of a height of the upper portion of the fin structure from an upper surface of the isolation insulating layer.

4. The method of claim 1, wherein an angle between an interface between a nitridated portion of the gate dielectric layer and a non-nitridated portion of the gate dielectric layer and a sidewall of the gate dielectric layer is 1 degree to 5 degrees.

5. The method of claim 1, wherein a nitrogen concentration at an interface between the gate dielectric layer and the upper portion of the fin structure after the nitridation operation is less than 3 atomic %.

6. The method of claim 1, wherein a part of the gate dielectric layer formed on the isolation insulating layer is also nitridated.

7. The method of claim 1, wherein a process temperature of the plasma nitridation operation is in a range from 50° C. to 450° C.

8. The method of claim 7, wherein a process duration of the plasma nitridation operation is in a range from 20 sec to 150 sec.

9. The method of claim 1, wherein an input RF power during the plasma nitridation operation ranges from about 300 W to about 2000 W.

10. A method for manufacturing a semiconductor device, the method comprising:
    forming a fin structure by patterning a semiconductor layer;
    forming an isolation insulating layer such that an upper portion of the fin structure protrudes from the isolation insulating layer;
    forming a gate dielectric layer over the fin structure by a deposition process;
    performing a nitridation operation on the gate dielectric layer; and
    forming a gate electrode layer over the gate dielectric layer, wherein:
    the gate dielectric layer as formed includes silicon oxide,
    the nitridation operation comprises a plasma nitridation operation using one or more of $N_2$ gas and $NH_3$ gas, and
    a flow ratio $NH_3/(N_2+NH_3)$ is in a range from 0.4 to 1.0.

11. The method of claim 10, wherein the flow ratio is in a range from 0.8 to 0.95.

12. The method of claim 10, wherein an entire outer surface of the gate dielectric layer is nitridated.

13. The method of claim 10, wherein a nitrogen concentration of the gate dielectric layer after the nitridation operation at a top region of the gate dielectric layer is greater than a nitrogen concentration at a bottom region of the gate dielectric layer.

14. The method of claim 10, wherein a nitrogen concentration at an interface between the gate dielectric layer and the upper portion of the fin structure after the nitridation operation is less than 3 atomic %.

15. The method of claim 10, wherein a depth of a nitridated portion of the gate dielectric layer formed on a sidewall of the upper portion of the fin structure is 20% to 80% of a thickness of the gate dielectric layer formed on the sidewall of the upper portion of the fin structure.

16. The method of claim 10, wherein the gate dielectric layer after the nitridation operation is a single layer in which a nitrogen concentration varies along a thickness direction.

17. A method for manufacturing a semiconductor device, comprising:
    forming a fin structure by patterning a semiconductor layer;
    forming an isolation insulating layer such that an upper portion of the fin structure protrudes from the isolation insulating layer;
    forming a gate dielectric layer over the fin structure by a deposition process;
    performing a nitridation operation on the gate dielectric layer; and
    forming a gate electrode layer over the gate dielectric layer, wherein:
    the nitridation operation comprises a plasma nitridation operation using one or more of a $N_2$ gas and a $NH_3$ gas, and
    a flow ratio $NH_3/(N_2+NH_3)$ varies during the nitridation operation.

18. The method of claim 17, wherein the flow ratio varies in a stepwise manner twice or more.

19. The method of claim 17, wherein the nitridation operation comprises a directional plasma nitridation.

20. The method of claim 17, wherein the flow ratio varies within a range from 0.4 to 1.0.

* * * * *